United States Patent [19]

Petersen

[11] Patent Number: 4,936,783
[45] Date of Patent: Jun. 26, 1990

[54] ELECTRONIC SOCKET FOR IC QUAD PACK

[75] Inventor: Kurt H. Petersen, Austin, Tex.

[73] Assignee: Minnesota Mining and Manufacturing Comnpany, St. Paul, Minn.

[21] Appl. No.: 289,227

[22] Filed: Dec. 21, 1988

[51] Int. Cl.⁵ .................................. H01R 9/09
[52] U.S. Cl. ............................. 439/70; 439/72; 439/331; 439/526; 206/331
[58] Field of Search ............... 439/70, 72, 73, 247, 439/330, 331, 525, 526; 206/331, 329, 328

[56] References Cited

U.S. PATENT DOCUMENTS

| | | | |
|---|---|---|---|
| 4,376,560 | 3/1983 | Olsson et al. | 439/70 |
| 4,378,139 | 3/1983 | Griffin et al. | 439/331 |
| 4,470,650 | 9/1984 | Lundergan | 439/70 |
| 4,535,887 | 8/1985 | Egawa | 439/526 |
| 4,553,805 | 11/1985 | Aikens | 439/70 |
| 4,591,053 | 5/1986 | Alemanni | 206/331 |
| 4,760,917 | 8/1988 | Vitek | 206/331 |
| 4,789,345 | 12/1988 | Carter | 439/330 |

Primary Examiner—P. Austin Bradley
Attorney, Agent, or Firm—Donald M. Sell; Walter N. Kirn; John C. Barnes

[57] ABSTRACT

A connector for mounting a plastic quad flat pack device having fine pitch leads is preferred that will protect the leads while the device is removed from supply trays and that will serve to define a lid as the device is placed in a socket. The lid has rods to frictionally engage the body of the device and ribs with undulating recesses to engage and support the fine leads of a said device.

13 Claims, 4 Drawing Sheets

ELECTRONIC SOCKET FOR IC QUAD PACK

BACKGROUND OF THE INVENTION

1. Field of the Invention

This invention relates to a connector for mounting an integrated circuit package (IC pack) into an electronic circuit and in one aspect to a lid or carrier device which fits over the IC pack to support the IC pack for handling and which supports and protects the leads of the IC pack and is locked into a socket to maintain the leads against the bias of contacts in said socket.

2. Description of the Prior Art

Carriers for supporting integrated circuit devices or packages are known and depending on the type and number of leads the devices are formed to support and cradle the packages to protect the package during handling. Examples of such carriers are disclosed in Letters U.S. Pat. Nos. 3,529,277 and 4,379,505. Additionally, sockets are known for removably supporting an IC pack in an electronic circuit such that the IC pack or device can be removed. The handling and placing of the device becomes more difficult however as the number of leads on a device increases and the spacing of the leads on a device become less and less. An integrated circuit package with leads projecting from all four edges of a device are known and are referred to as a "quad flat pack" and the leads can be fine pitch at 0.025 inch (0.635 mm) between leads. These leads are formed in a "gull-wing" pattern, i.e. they are formed to project outward then downward and outward again below the lower plane of the plastic molding encapsulating the integrated circuit and forming the body of the package. The body of the package can also have "bumpers" which are molded at the time of encapsulation to project outward diagonally at the corners beyond the ends of the leads. The bumpers are used in shipping to support the device in trays or tubes without allowing contact between the leads of adjacent devices or packages. These devices however are still difficult to handle without damaging or dislocating the leads. The leads are fragile. Any mishandling bends them and almost any contact will bend them. The 0.025 inch pitch surface mount usually requires mounting the devices in very exact mechanical sockets. The handling is further complicated when high priced pick and place automatic equipment is not used by the assembly house because of the price. Further, high lead count surface mount packages are difficult to remove and replace on a printed circuit board.

The present invention answers the problems involved in the handling of the quad packages with close spaced leads. It is designed to be used to pick a quad flat pack from a tray by hand by using the lid or carrier device of the present invention. The lid is designed to carry the device with the leads protected from damage as it is placed in a socket. The lid is then latched in place on the socket. The lid acts to back up the leads and provides the contact pressure to assure reliable long term electrical continuity. The socket is formed of identical bars each supporting a plurality of contacts having connecting ends which may be through hole mounted to a printed circuit board. The socket has the latches to hold the lid and quad pack in place which allows the device to be removed for replacement or upgrading as needed.

SUMMARY OF THE INVENTION

The present invention provides a connector for mounting removably an IC quad flat pack in an electronic circuit. The connector comprises a lid and a socket. The lid is a subcarrier or device carrier which is used to remove the IC pack from a tray and while protecting the leads to mount the same in the socket which may be connected to the electronic circuit. The device carrier remains with the IC quad pack and is latched in the socket to assure reliable long term electrical continuity of the IC device in the electronic circuit.

The integrated circuit package carrier of the present invention affords the handling of a gull-wing quad IC flat package to lift it from a tray and deliver the same to a mounting position in an electronic circuit. The carrier comprises a frame member of rectangular configuration having a window in the center thereof of rectangular configuration. The frame member has an upper surface and an opposite surface with the window communicating therebetween and rib means project from the opposite surface at locations adjacent the peripheral edges of said frame. The rib means have free edges disposed in a plane parallel with said frame member and the free edges are formed with spaced parallel recesses for receiving and separating the leads of a gull-wing quad IC package. Finger means extend from the opposite surface of the frame member adjacent the corners thereof affording frictional interference with the outside edge of a the IC package between the outside leads thereof and the corners. The rib means comprise wall members which extend along the sides of the frame member and terminate in spaced relationship to the corners of the frame member affording openings in the corners to receive the bumpers of an IC package and reduce the size of the carrier necessary to accommodate the same quad flat pack. The finger means comprise thin integrally molded rods extending from the opposite surface adjacent opposite ends of opposed wall members forming the rib means positioned along each set of leads along the four sides of the quad flat pack.

The socket comprises a frame having four bars joined at their ends to define a rectangular shaped member. Each bar has a plurality of contacts. The contacts each have a connecting end for connection to an electronic circuit, a contacting portion for contacting a lead on a quad flat pack, and a resilient portion intermediate said connecting end and the contacting portion affording mounting of the contact and for affording resilient pressure contact with a lead of an IC quad flat pack. A latch means on the bars is provided for engaging the frame member of the device carrier to hold the leads of the IC quad pack in engagement with the contacting portions of the contacts against the bias of the resilient intermediate portions of the contacts.

BRIEF DESCRIPTION OF THE DRAWING

The present invention will be further described with reference to the accompanying drawing, wherein.

DESCRIPTION OF THE PREFERRED EMBODIMENT

Figure 1:
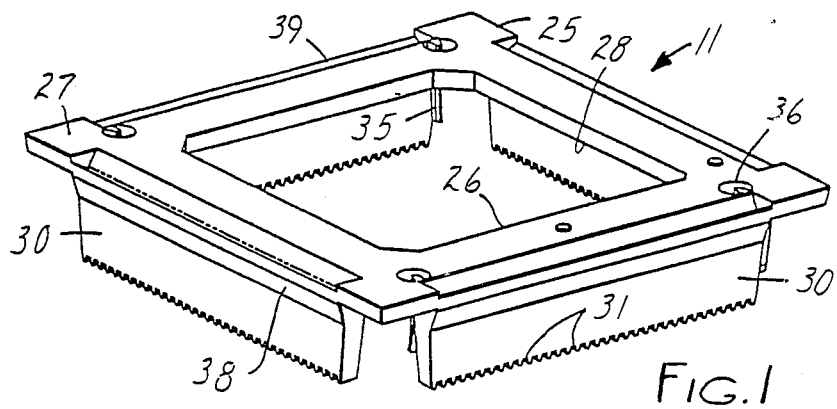
FIG. 1 is a perspective view of a lid or carrier according to the present invention.

The present invention will be described with reference to the accompanying drawing wherein like reference numerals in the several views refer to like parts.

Figure 2:
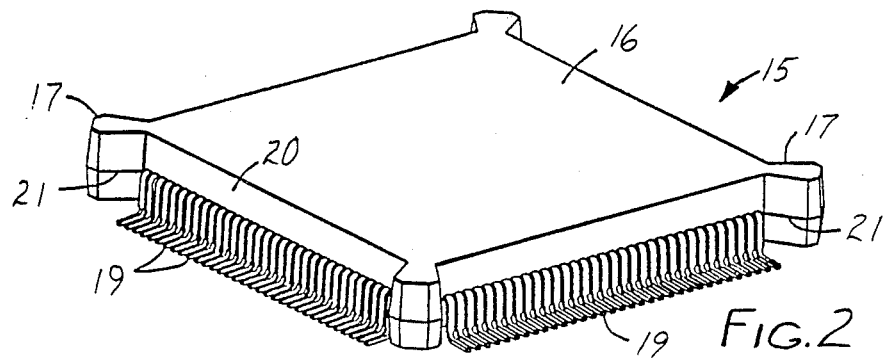
FIG. 2 is a perspective view of a gull-winged plastic quad flat pack or IC package known in the art.

The connector of the present invention comprises a carrier or a subcarrier 11 and a socket 12 adapted for mounting onto a printed circuit board or other electronic circuit device. The carrier 11 is formed to define a lid for the central recess of the socket 12 to retain an IC plastic quad flat pack or device 15, as shown in FIG. 2, in place in the socket 12. The carrier 11 is also designed for handling a device 15. The carrier will fit over the device 15 in a supply tray (not shown) and allow the same to be lifted from the tray while protecting the fragile leads.

Referring to FIG. 2 for the purpose of describing the elements of the quad flat pack device 15, it is seen that it has a generally rectangular shape defined by a plastic body 16 encapsulating the integrated circuit, and that the body 16 has integrally molded bumpers 17 extending outwardly from the corners, generally diagonally. These bumpers 17 are used in shipping to support the device 15 in trays or tubes without allowing contact between the leads and the walls of the tube or tray or between the leads of adjacent devices. The body has a plurality of closely spaced leads 19 having a gull-wing pattern, i.e. they extend outwardly from the side walls 20 and then downwardly and then outwardly again below the plane of the bottom of the body 16. The illustrated leads are spaced at 0.025 inch (0.635 mm) and thus are said to be fine pitch and the fragile nature of the leads makes the devices 15 very susceptible to damage if handled. The side walls 20 of the body 16 of the device 15 are beveled or inclined such that the walls are not perpendicular to the plane of the top surface or the bottom surface. The slight incline extends from the parting line 21 to the top surface and to the bottom surface as illustrated in FIG. 2.

The carrier 11 comprises a frame member 25 of rectangular configuration having a centrally located opening defining a window 26 in the center thereof of rectangular configuration. The frame member 25 has an upper surface 27 and an opposite surface 28 with the window 26 communicating therebetween. Projecting from the lower surface 28 are rib means which extend along the side walls of the device 15 and along the downwardly extending portions of the leads 19. The rib means comprise four wall members 30 located adjacent the peripheral edges of the frame member 25. The wall members 30 have free edges disposed in a plane parallel with the bottom surface 28 of the frame member 25 and the free edges are formed with spaced parallel recesses 31 for receiving and separating the lower outwardly projecting portions of the leads 19. The recesses 31 form an undulating pattern or square wave pattern which corresponds to the spacing of the leads and the recesses 31 have a width sufficient to receive the leads therein and preferably a depth greater than the thickness of the material forming the leads. The recesses 31 maintain the leads separated and protected from damage during handling. The wall members 30 and recesses 31 also serve to back up the leads and support them against the bias of the contacts in the socket 12. Further, the recesses receive the contacting portions of the contacts to improve alignment with the leads 19 and restrict displacement. The wall members 30 extend along the sides of the frame member 25 and terminate in spaced relationship to the corners of the frame member 25 affording openings in the corners to receive the bumpers 17 of the device 15 and reduce the size of the carrier necessary to accommodate the same quad flat pack.

Finger means extend below the surface 28 of the frame member adjacent the corners thereof affording frictional interference with the outside edge of the device 15 between the outside leads thereof and the corners. The finger means comprises a number of thin integrally molded rods 35 extending from the surface 28 adjacent the corners of the carrier. The rods 35 are preferably positioned adjacent opposite ends of a pair of the opposed wall members 30 and are formed in the wall of four openings 36 extending from the upper surface 27 to the lower opposite surface 28 for purposes of molding the finger means. The rods 35 diverge slightly from the vertical inner surface of the wall members 30 to afford sufficient frictional engagement with the side walls 20 of the device 15 to lightly grasp the outside edge of the body 16 of the device 15 and the inner edge of the bumpers 17. The rods 35 engage the body 16 to center the device 15 in the carrier before the ribs 31 come in contact with the leads 19. When the lid 11 is placed over the device 15 the rods 35 retain the device in place affording the lifting of the device 15 from a supply tray.

The wall members 30 are formed with portions 38 of the outer faces thereof inclined inwardly from the outer peripheral edges of the frame member 25 such that the outer face of the ribs 30 guide the carrier 11 and the device 15 into correct alignment within the socket 12. Along the peripheral edges of the frame member 25 of the carrier 11 and opposite the ribs or wall members 30 are grooves 39 extending parallel to the edges. The grooves 39 serve to releasably capture hooks 40 formed on latch members 41 of the sockets 12.

The socket 12 of the connector is formed of four identical bars 45 joined at their ends. Each bar supports a plurality of contacts 51A, 51B and 51C, which contacts are arranged to engage three rows of openings in a printed circuit board and afford aligned contacting portions at a location within the socket to engage the lower outwardly projecting portions of the leads 19 supported in recesses 31.

As illustrated in FIGS. 3, 5, 6 and 7, the bars 45 of the socket 12 each comprise a central body portion 46 formed with contact receiving grooves, an upwardly disposed standard 47 having three defined openings to receive one side of the latch member 41, and opposite ends 48 and 49. The end 48 is bifurcated to define a pair of parallel spaced plate members each with a notch in one side and the end 49 is bifurcated to define three parallel spaced plate members, each of which is also formed with a notch in the one side. The plate members at the ends are of a thickness and are spaced such that the plates at the end 48 of one bar 45 fits within and support means, which in the present embodiment are between the plates of an end 49 of another bar and spiral pins 50 are received within the notches to secure the bars together at the corners to form the rectangular socket 12.

Figure 8A:
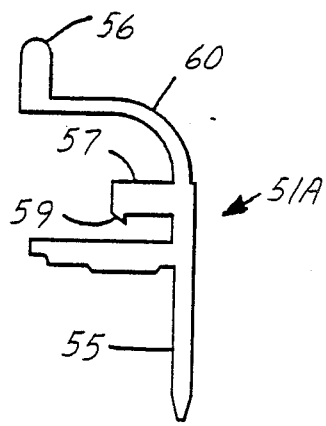
FIGS. 8A, 8B and 8C are side views of the contacts used in the socket of FIG. 3 and the bars of FIGS. 5, 6 and 7.
Figure 8B:
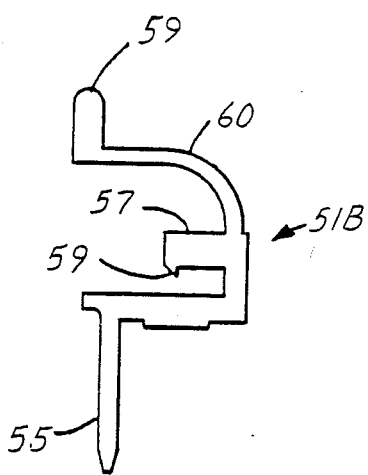
Figure 8C:
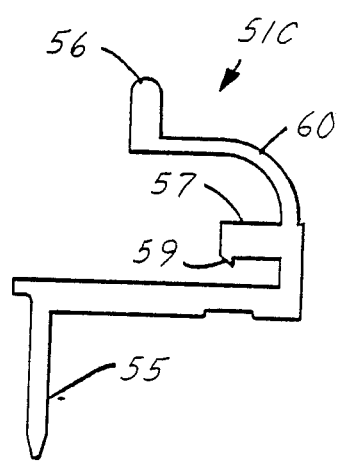
Figure 6:
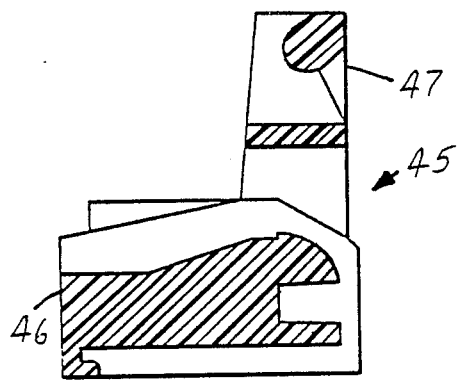
FIG. 6 is a vertical section along line 6—6 of FIG. 5.
Figure 7:
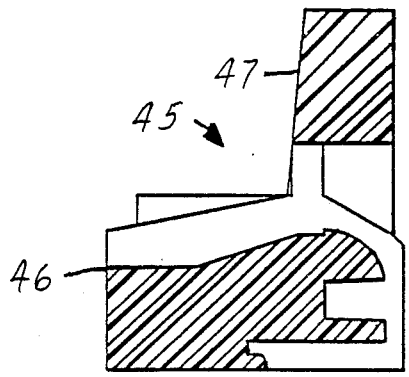
FIG. 7 is a vertical section along line 7—7 of FIG. 5.

The contacts 51A, 51B and 51C, as illustrated in FIGS. 8A, 8B and 8C each comprise a connecting end 55 adapted to receive an external electronic member, such as the pin illustrated ends adapted to fit through openings in a printed circuit board. The opposite end of each contact is formed with contacting portion 56 to engage the leads 19 of a device 15 and intermediate the ends 55 and 56 the contacts are formed with an anchor portion 57 including a retaining barb 59 and a spring portion 60 for resiliently urging the contacting portion 56 into engagement with the end of a lead 19. The three sizes of contacts as illustrated are inserted into the slots in the bar 45 in staggered order to match the format for the pins at the contacting end 55 corresponding to the format on the printed circuit board.

Figure 3:
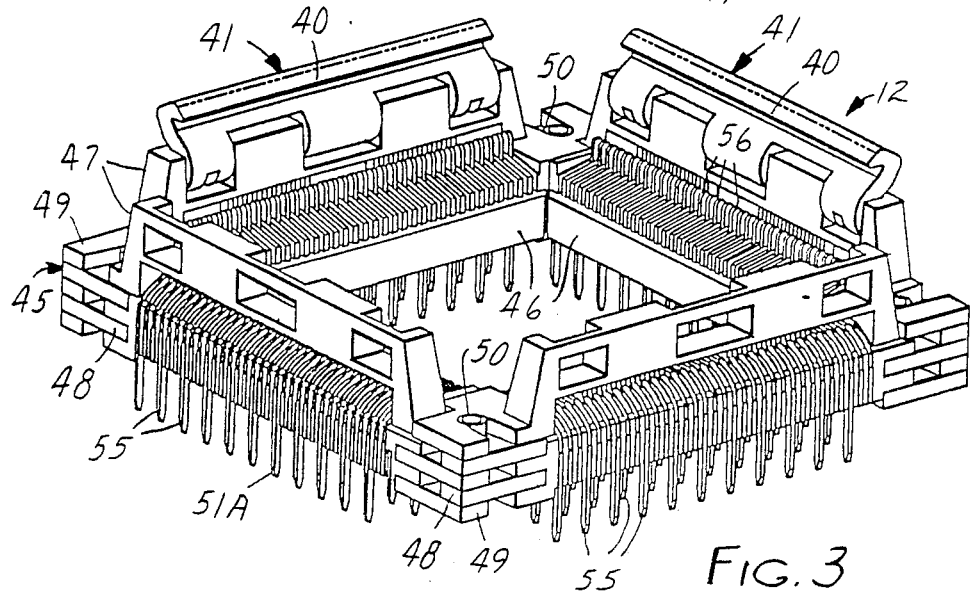
FIG. 3 is a perspective view of a socket, with two of the latches removed for the purpose of exposing more of the inner portions of the socket, for receiving the IC package of FIG. 2, when carried in the lid or carrier of FIG. 1.
Figure 4:
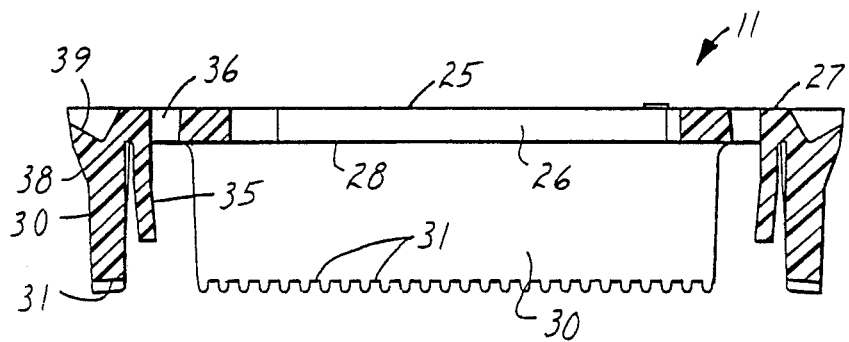
FIG. 4 is a vertical sectional view of the carrier of FIG. 1.
Figure 5:
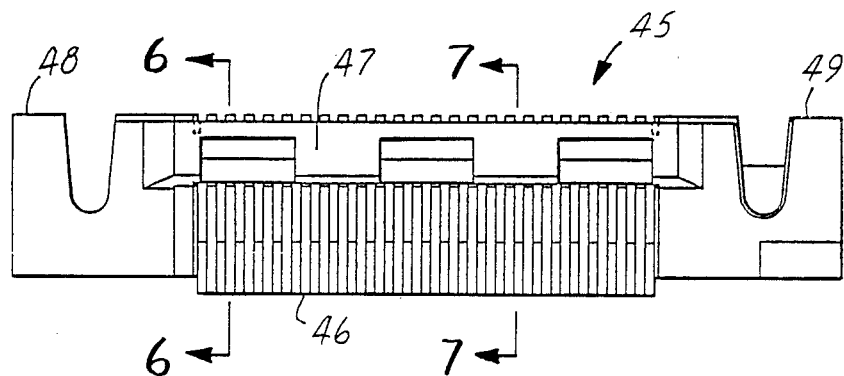
FIG. 5 is a top view of a bar of the socket of FIG. 3.
Figure 9:
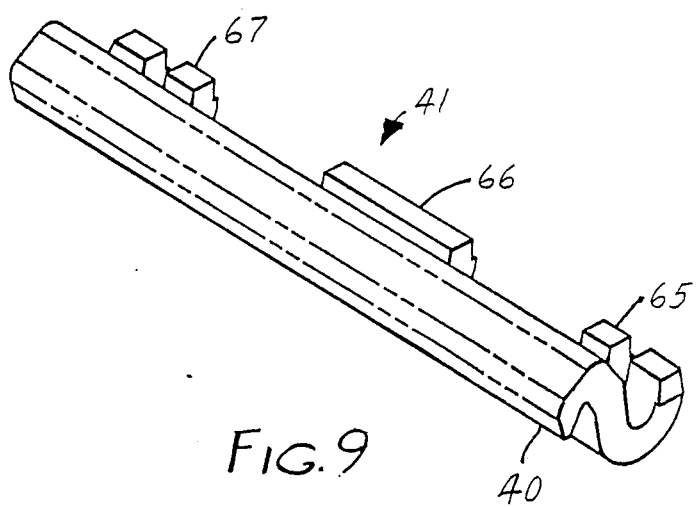
FIG. 9 is a perspective view of a latch member separated from a bar of the socket of FIG. 3.

The latch member 41 of the socket 12 is illustrated in FIGS. 3 and 9. The latch member comprises an elongate member having a reversed S shape in end view with a hook 40 extending along the length of the member at one edge and three spaced support hooks 65, 66 and 67 respectively along the other edge to be received in the three defined openings of the standard 47 on a bar 45. The latch member 41 is pivoted about the surfaces of the hooks 65, 66, and 67 and the surfaces of the openings in the standard and the resilience of the spring portions 60 of the many contacts 51A, 51B and 51C of the socket 12 maintain the hook 40 of each latch 41 in engagement with the associated groove 39 of the carrier 11 to hold the leads in good electrical contact with the contacting portions 56 of the contacts.

As a lid 11 and device 15 are placed in the socket 12 the latches are pivoted to a closed latched position and the lid is released. The device can be removed by forcing the lid downward slightly and moving the latches to a released position away from the grooves 39 in the lid.

Having described the present invention with reference to a preferred embodiment thereof, it is to be appreciated that minor modifications may be made therein without departing from the invention as defined in the appended claims.

I claim:

1. An integrated circuit carrier for affording the handling of an integrated circuit encapsulated in a package of rectangular configuration and having multiple leads projecting from opposed edge walls thereof, then extending parallel to said edge walls and then outwardly from said edge walls, said carrier being adapted to surround and lift the package from a supply tray having dividers separating each package and deliver the package to a mounting position in an electronic circuit, said carrier comprising a frame member of rectangular configuration defined by peripheral edges and having an upper planar surface and an opposite surface, rib means projecting from said opposite surfaces at said peripheral edges of said frame member for defining a space therebetween for receiving a said package, said rib means having free edges disposed in a plane parallel with said opposite surface of said frame member and said free edges being formed with spaced recesses for receiving and separating the leads of a said package, and finger means, extending from said opposite surface adjacent the corners of said frame member, for frictionally engaging opposed outside edge walls of a said package positioned between the outside leads of a said package and the corners of a said package to retain a said package in said carrier.

2. A carrier according to claim 1 wherein said finger means comprise a thin integrally molded rod extending from said opposite surface adjacent said rib means.

3. A carrier according to claim 1 wherein said package includes bumpers which project diagonally outward from the corners thereof to protect the leads, and said rib means comprise wall members which extend along the peripheral edges of the frame member and terminate in spaced relationship to the corners of the frame member affording openings in the corners between said wall members to receive said bumpers of a said package.

4. A carrier according to claim 3 wherein said finger means comprise thin integrally molded rods extending from said opposite surface adjacent opposite ends of opposed wall members forming said rib means.

5. A connector for mounting an IC quad pack in an electronic circuit, said connector comprising a carrier comprising a rectangular frame member defined by peripheral edges and having an upper generally planar surface and an opposite surface, rib means projecting from said opposite surface at said peripheral edges of said frame member for defining a space therebetween for receiving a said IC quad pack, a central window communicating between said surfaces, said rib means having free edges disposed in a plane parallel with said opposite surface of said frame member and said free edges being formed with spaced recesses for receiving and separating the leads of a said IC quad pack, and finger means extending from said opposite surface adjacent the corners of said frame member for frictionally engaging opposed outside edge walls of a said IC quad pack positioned between the outside leads of a said IC quad pack and the corners of a said IC quad pack to retain the same between said rib means, and a socket comprising a frame defining a rectangular shaped member, said frame having a plurality of contacts, said contacts each having a connecting end for connection to an electronic circuit and a contacting portion for contacting a lead on a said IC quad pack, and a resilient portion intermediate said connecting end and said contacting portion affording resilient pressure contact with a lead of a said IC quad pack, and latch means on said frame for engaging said frame member of said carrier to hold the leads of a said IC quad pack in engagement with said contacting portions of said contacts against the bias of said resilient portions of said contacts.

6. A connector according to claim 5 wherein said latch means comprises an elongate member extending along each side of said frame defining said socket, said elongate members being pivoted to said frame for movement over the edges of said frame member opposite said one side of said frame member and said free edges of said rib means to oppose the resilient pressure of said contacts.

7. A socket for connecting an IC quad pack in an electronic circuit, said socket comprising four identical bars each bar having plate means at opposite ends which are nonsymmetrical for mating with an end of an adjoining bar wherein said four bars will form a rectangular frame, with nonsymmetrical ends fitting together to define a corner, each bar having a plurality of contacts, said contacts each having a connecting end for connection to an electronic circuit and a contacting portion for contacting a lead on a said quad pack, and a resilient portion intermediate said connecting end and said contacting portion affording resilient pressure contact with a lead of a said IC quad pack, and each bar having latch means for holding the leads of a said IC quad pack in compressive engagement with said contacting portion of said contacts.

8. A socket according to claim 7 wherein said bar has a standard positioned between said plate means and across said contacts, and said latch means includes an elongate member pivoted to said standard and extending along said standard.

9. A socket according to claim 7 wherein said bar has a standard positioned across said contacts with the resilient portion of said contacts positioned through slots in the standard, and said latch means includes an elongate member pivoted at spaced points along its length to said standard and extending along said bar across said contacts.

10. An integrated circuit carrier for affording the handling of an integrated circuit encapsulated in a package of rectangular configuration and having multiple leads projecting outwardly from opposed edge walls thereof, then extending generally parallel to said edge walls and then terminating with ends projecting outwardly from said edge walls, and bumpers projecting diagonally outward from the corners to protect the leads, said carrier being adapted to surround and lift the package from a supply tray having dividers separating each package and deliver the package to a mounting position in an electronic circuit, said carrier comprising a frame member of rectangular configuration defined by peripheral edges and having a first planar surface and an opposite surface, rib means projecting from said opposite surface at locations adjacent said peripheral edges of said frame member, said rib means having free edges disposed in a plane parallel with said frame member and said free edges being formed with spaced recesses for receiving and separating the ends of the leads of a said package, said rib means having ends which terminate in spaced relationship to the corners of the frame member affording openings in the corners between said rib means adjacent the edges of said frame member for receiving the bumpers of a said package, and finger means, extending from said opposite surface adjacent the ends of said rib means, for frictionally engaging opposed outside edge walls of a said package positioned between the outside leads and the bumpers of a said package to retain a said package in said carrier.

11. A carrier according to claim 10 wherein said finger means comprise a plurality of rods integral with said frame member to frictionally engage the opposite edge walls of the package and the inner edge of the adjacent bumpers where they meet the opposite edge walls for centering said package within said rib means.

12. A connector for mounting an IC quad pack having a plurality of leads extending from opposite edges thereof in an electronic circuit, said connector comprising a carrier comprising a rectangular frame member having means for supporting a said quad pack and the leads thereof for engagement by individual contacts, and a socket comprising four equal bars each having a plurality of contacts for making contact with the individual leads of a said quad pack, and support means to support said bars to form a rectangular shape for cooperating with said carrier and a said quad pack to position the said contacts for engagement with the leads of a said quad pack, each bar comprising a body portion having contact receiving grooves in spaced relationship along said body portion, a contact disposed in each of said grooves, said contacts comprising a connecting end for connection to an external electronic member, a contacting portion for engaging a lead of a said quad pack, and an intermediate spring portion for resiliently urging the contacting portion into engagement with a lead of a said quad pack.

13. A socket for use in making temporary electrical connection between an electronic integrated circuit package and an electronic circuit, said socket comprising four individual bars each having a plurality of contacts for making contact with a said package, and support means to support said bars in a rectangular shape for cooperating with the shape of a said package, each bar comprising a body portion having contact receiving grooves in spaced relationship along said body portion, a contact disposed in each of said grooves, said contacts comprising a connecting end for connection to an external electronic circuit, a contacting portion for engaging a said package, and an intermediate spring portion for resiliently urging the contacting portion into engagement with a said package.

* * * * *